US009812561B2

United States Patent
Yoshimura et al.

(10) Patent No.: US 9,812,561 B2
(45) Date of Patent: Nov. 7, 2017

(54) SEMICONDUCTOR DEVICE MANUFACTURING METHOD, INCLUDING SUBSTRATE THINNING AND ION IMPLANTING

(71) Applicant: FUJI ELECTRIC CO., LTD., Kawasaki-shi (JP)

(72) Inventors: Takashi Yoshimura, Matsumoto (JP); Hidenao Kuribayashi, Matsumoto (JP); Yuichi Onozawa, Matsumoto (JP); Hayato Nakano, Kofu (JP); Daisuke Ozaki, Okaya (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/070,429

(22) Filed: Mar. 15, 2016

(65) Prior Publication Data

US 2016/0197170 A1    Jul. 7, 2016

Related U.S. Application Data

(60) Division of application No. 14/079,072, filed on Nov. 13, 2013, now Pat. No. 9,324,847, which is a
(Continued)

(30) Foreign Application Priority Data

May 18, 2011  (JP) .................................. 2011-111709

(51) Int. Cl.
  *H01L 21/332*   (2006.01)
  *H01L 29/739*   (2006.01)
  (Continued)

(52) U.S. Cl.
  CPC .... *H01L 29/7397* (2013.01); *H01L 21/26513* (2013.01); *H01L 21/2855* (2013.01);
  (Continued)

(58) Field of Classification Search
  CPC ........... H01L 21/26513; H01L 21/2855; H01L 21/324
  (Continued)

(56) References Cited

U.S. PATENT DOCUMENTS 6,737,705 B2 * 5/2004 Momota ............. H01L 29/7397
                                                    257/139
9,324,847 B2    4/2016 Yoshimura et al.
(Continued)

FOREIGN PATENT DOCUMENTS

DE    102006046845 A1    4/2008
JP       09121052 A       5/1997
(Continued)

OTHER PUBLICATIONS

Extended European Search Report issued in European Appln. No. 12785949.4 dated Oct. 14, 2014.
(Continued)

*Primary Examiner* — Olik Chaudhuri
*Assistant Examiner* — Wilner Jean Baptiste
(74) *Attorney, Agent, or Firm* — Rossi, Kimms & McDowell LLP

(57) ABSTRACT

In some aspects of the invention, an n-type field-stop layer can have a total impurity of such an extent that a depletion layer spreading in response to an application of a rated voltage stops inside the n-type field-stop layer together with the total impurity of an $n^-$ type drift layer. Also, the n-type field-stop layer can have a concentration gradient such that the impurity concentration of the n-type field-stop layer decreases from a $p^+$ type collector layer toward a p-type base layer, and the diffusion depth is 20 μm or more. Furthermore, an $n^+$ type buffer layer of which the peak impurity concentration can be higher than that of the n-type field-stop layer at $6 \times 10^{15}$ $cm^{-3}$ or more, and one-tenth or less of the peak
(Continued)

impurity concentration of the p⁺ type collector layer, can be included between the n-type field-stop layer and p⁺ type collector layer.

6 Claims, 7 Drawing Sheets

Related U.S. Application Data continuation of application No. PCT/JP2012/062875, filed on May 18, 2012.

(51) Int. Cl.
| | | |
|---|---|---|
| H01L 29/08 | (2006.01) | |
| H01L 29/36 | (2006.01) | |
| H01L 29/66 | (2006.01) | |
| H01L 21/265 | (2006.01) | |
| H01L 21/285 | (2006.01) | |
| H01L 21/324 | (2006.01) | |
| H01L 29/06 | (2006.01) | |
| H01L 29/10 | (2006.01) | |
| H01L 29/167 | (2006.01) | |
| H01L 29/423 | (2006.01) | |

(52) U.S. Cl.
CPC ........ *H01L 21/324* (2013.01); *H01L 29/0615* (2013.01); *H01L 29/0619* (2013.01); *H01L 29/0804* (2013.01); *H01L 29/0821* (2013.01); *H01L 29/0834* (2013.01); *H01L 29/1004* (2013.01); *H01L 29/1095* (2013.01); *H01L 29/167* (2013.01); *H01L 29/36* (2013.01); *H01L 29/4236* (2013.01); *H01L 29/66348* (2013.01); *H01L 29/7395* (2013.01); *H01L 29/0847* (2013.01)

(58) Field of Classification Search
USPC ....................................................... 438/515
See application file for complete search history.

(56) References Cited

U.S. PATENT DOCUMENTS

| | | |
|---|---|---|
| 2001/0005024 A1 | 6/2001 | Bauer et al. |
| 2002/0117712 A1* | 8/2002 | Matsudai .......... H01L 29/66333 257/330 |
| 2002/0121660 A1 | 9/2002 | Otsuki et al. |
| 2002/0127783 A1 | 9/2002 | Otsuki et al. |
| 2005/0035398 A1* | 2/2005 | Williams ............ H01L 29/7827 257/329 |
| 2008/0128798 A1 | 6/2008 | Schulze et al. |
| 2009/0184340 A1 | 7/2009 | Nemoto et al. |
| 2010/0052011 A1 | 3/2010 | Harada |
| 2011/0034013 A1* | 2/2011 | Hatem ................ H01L 21/2236 438/515 |
| 2012/0267681 A1 | 10/2012 | Nemoto et al. |

FOREIGN PATENT DOCUMENTS

| | | |
|---|---|---|
| JP | 2002520885 A | 7/2002 |
| JP | 2002261282 A | 9/2002 |
| JP | 2002299346 A | 10/2002 |
| JP | 2002314084 A | 10/2002 |
| JP | 2004079878 A | 3/2004 |
| JP | 2004103982 A | 4/2004 |
| JP | 3687614 B2 | 8/2005 |
| JP | 2008103562 A | 5/2008 |
| JP | 2008211148 A | 9/2008 |
| JP | 2009176892 A | 8/2009 |
| JP | 2010056134 A | 3/2010 |
| WO | 2011052787 A1 | 5/2011 |

OTHER PUBLICATIONS

Office Action issued in Japanese Appln. No. 2013-515238 dated Mar. 3, 2015.
Notice of Allowance issued in U.S. Appl. No. 14/079,072 dated Dec. 23, 2015.
Office Action issued in U.S. Appl. No. 15/084,549, dated Sep. 12, 2016.
Notice of Allowance issued in U.S. Appl. No. 15/084,549 dated Jul. 12, 2017.

\* cited by examiner

SEMICONDUCTOR DEVICE MANUFACTURING METHOD, INCLUDING SUBSTRATE THINNING AND ION IMPLANTING

This application is a continuation of International Application No. PCT/JP2012/062875, filed on May 18, 2012, which is based on and claims priority to Japanese Patent Application No. JP PA 2011-111709, filed on May 18, 2011. The disclosure of the Japanese priority application and the PCT application in their entirety, including the drawings, claims, and the specification thereof, are incorporated herein by reference.

BACKGROUND

1. Field of the Invention

Embodiments of the invention relate to a semiconductor device and semiconductor device manufacturing method, and in particular, relate to a semiconductor device and semiconductor device manufacturing method such that a field-stop layer is provided on a substrate back surface side.

2. Related Art

An IGBT (Insulated Gate Bipolar Transistor) is a power element wherein the high speed switching characteristics and voltage drive characteristics of a MOSFET (Metal-Oxide-Semiconductor Field Effect Transistor) and the low on-state voltage characteristics of a bipolar transistor are configured in one chip.

IGBTs are also often used together with an FWD (free wheeling diode) or the like, and have expanded to be used in the field of industrial instruments such as general purpose and electric vehicle inverters and alternating current (AC) servos, uninterruptible power supplies (UPS), and switching power supplies, and in the field of consumer instruments such as microwave cookers, rice cookers, and stroboscopes. Furthermore, IGBTs with lower on-state voltages have been developed as elements improved to next generation types, and lower loss and higher efficiency have been achieved for applied devices.

An element using an FZ-n-type silicon (Si) substrate formed of an inexpensive FZ (Float Zone) wafer instead of a heretofore known expensive epitaxial wafer has been developed as this kind of IGBT. Furthermore, a field-stop (FS) IGBT (hereafter referred to as a trench-FS-IGBT) including a trench MOS gate (an insulated gate formed of a metal-oxide film-semiconductor) structure (hereafter referred to as a trench MOS structure) is commonly known as an IGBT. FIG. 5 is a main portion sectional view showing the configuration of a heretofore known FS-IGBT.

As shown in FIG. 5, the trench-FS-IGBT includes a plurality of trenches 11 on the front surface side of a Si substrate that forms an n⁻ type drift layer 1. Inside the trench 11, a gate dielectric film 10 is provided along the inner wall of the trench 11, and a gate electrode 7 is provided on the inner side of the gate dielectric film 10. A p-type base layer 5 is provided in portions of the Si substrate sandwiched between the trenches 11, whereby a trench MOS structure 12 formed of the gate electrode 7, gate dielectric film 10, and p-type base layer 5 is configured on the front surface side of the Si substrate.

Furthermore, an n⁺ type emitter region 4 and p⁺ contact region 6 are selectively provided in a surface layer of the p-type base layer 5. The n⁺ type emitter region 4 is disposed so as to be in contact with the upper side (aperture portion side) end of a side surface of the trench 11. An emitter electrode 9 is provided forming ohmic contact to both the n⁺ type emitter region 4 and p-type base layer 5 (p⁺ contact region 6). A p⁺ type collector layer 3 and a collector electrode 8 are provided on the back surface side of the Si substrate. A field-stop (FS) layer 2 is provided between the p⁺ type collector layer 3 and n⁻ type drift layer 1.

By using the FZ-n-type Si substrate that forms the n⁻ type drift layer 1, it is possible to reduce the wafer cost. Also, by providing the FS layer 2, it is possible for the thickness of the Si substrate to be less than that of a non-punch through (NP) IGBT, and to be a thickness commensurate with the breakdown voltage, and thus possible to reduce the on-state voltage. Also, by the p⁺ type collector layer 3 being a low implantation collector that has a low dose and is shallow, it is possible to turn off at a high speed without carrying out lifetime control using electronic irradiation or the like.

A trench-FS-IGBT wherein the trench MOS structure 12, of a configuration wherein a MOS gate structure is provided on the inner walls of the trenches 11 disposed to a high density on the front surface of the semiconductor substrate, and an FS-IGBT, of a configuration wherein the FS layer 2 is provided on the back surface of the semiconductor substrate, are combined in this way is a mainstream device on the market.

As previously described, the trench-FS-IGBT shown in FIG. 5 is such that, by the FS layer 2 being provided, it is possible to reduce the on-state voltage by reducing the thickness of the Si substrate (wafer). However, a thin wafer is liable to crack during the manufacturing process, causing the efficiency rate to deteriorate, because of which a wafer that has not been thinned is used as it is when being introduced into the manufacturing process. In a subsequent process, after the trench MOS structure 12 has been formed on the front surface side of the wafer, the wafer is thinned to a thickness necessary for the breakdown voltage. A back grinding process whereby the wafer is thinned from the back surface by grinding, etching, or the like, has been proposed as a process for thinning the wafer. See, for example, JP-A-2002-299346 (also referred to herein, as "PTL 1").

Also, a method whereby a two-stage buffer layer (FS layer), configured of a diffusion layer with a low impurity concentration formed deeply from the wafer back surface side and a diffusion layer with a high impurity concentration formed shallowly from the wafer back surface side, is formed using phosphorus (P) as the dopant for forming the FS layer or buffer layer (not shown) has been proposed as a method of improving the voltage resistance of the FS-IGBT. See, for example, JP-A-2002-261282 (also referred to herein as "PTL 2"). In PTL 2, by adopting a two-stage buffer layer, it is possible to prevent the occurrence of drain voltage and drain current oscillation, which is liable to occur when turning off. Also, it is possible to prevent an adverse effect on characteristics depending on the precision of the amount of polishing when back grinding in order to thin the wafer.

Furthermore, a method whereby the FS-layer is efficiently formed as a deep diffusion layer with a low impurity concentration using an n-type impurity such as selenium (Se) or sulfur (S), which have a higher diffusion constant than that of phosphorus, rather than phosphorus as the dopant for forming the FS layer has been proposed as a method of forming an FS-IGBT. See, for example, JP-T-2002-520885 (also referred to herein as "PTL 3").

Also, an FS-IGBT including a structure wherein the ratio between the widths of the drift layer and depletion layer and the ratio between the impurity concentrations of the collector layer and buffer layer are each regulated has been proposed as a high breakdown voltage FS-IGBT wherein the voltage resistance in a safe operation region at a time of a short circuit current shut-off is improved. See, for example, JP-A-2010-56134 (also referred to herein as "PTL 4").

However, in PTL 2, there is a description of a layer structure that can improve resistance to element destruction, but there is no mention of a layer structure for preventing thermal runaway destruction or a layer structure for suppressing variation in on-state voltage. Also, in PTL 4, the voltage resistance in a safe operation region at a time of a short circuit current shut-off is improved by adopting a layer configuration such that the injection efficiency of holes from the p$^+$ type collector layer to the n-type buffer layer is high. The hole injection efficiency being high means, on the other hand, that there is concern that the leakage current will increase, which also suggests that thermal runaway destruction is liable to occur. However, no layer configuration with an advantage of preventing thermal runaway destruction is clarified in PTL 4.

SUMMARY OF THE INVENTION embodiments of the invention, in order to eliminate the heretofore described problems with the heretofore known technology, has an object of providing a semiconductor device and semiconductor device manufacturing method such that it is possible to balance an improvement in resistance to element destruction when a short circuit occurs with suppressing thermal runaway destruction. Also, the invention, in order to eliminate the heretofore described problems with the heretofore known technology, has an object of providing a semiconductor device and semiconductor device manufacturing method such that it is also possible to reduce variation in on-state voltage.

In order to solve the heretofore described problems, and to achieve the objects of the invention, a semiconductor device according to a first aspect of the invention is characterized by including a first conductivity type drift layer formed of a first conductivity type semiconductor substrate, a second conductivity type base layer formed in a surface layer of one main surface of the first conductivity type semiconductor substrate, a first conductivity type emitter layer formed in a surface layer on the first conductivity type semiconductor substrate one main surface side of the second conductivity type base layer, a gate dielectric film provided on the one main surface of the first conductivity type semiconductor substrate and in contact with the first conductivity type emitter layer, second conductivity type base layer, and first conductivity type drift layer, a gate electrode facing the first conductivity type emitter layer, second conductivity type base layer, and first conductivity type drift layer with the gate dielectric film interposed therebetween, a MOS gate structure formed of the first conductivity type drift layer, second conductivity type base layer, first conductivity type emitter layer, gate dielectric film, and gate electrode, a second conductivity type collector layer provided on the other main surface of the first conductivity type semiconductor substrate, a first conductivity type field-stop layer provided between the first conductivity type drift layer and second conductivity type collector layer and having an impurity concentration higher than that of the first conductivity type drift layer, and a first conductivity type buffer layer provided between the first conductivity type field-stop layer and second conductivity type collector layer, wherein the net doping concentration of the first conductivity type field-stop layer is higher than the net doping concentration of the first conductivity type drift layer, the total amount of the net doping concentration of the first conductivity type field-stop layer and net doping concentration of the first conductivity type drift layer has a value such that a depletion layer edge of a depletion layer spreading in the first conductivity type drift layer and first conductivity type field-stop layer in response to an application of a rated voltage is inside the first conductivity type field-stop layer, the impurity concentration distribution of the first conductivity type field-stop layer has a concentration gradient that decreases from the other main surface side of the first conductivity type semiconductor substrate toward the one main surface side, the depth of the first conductivity type field-stop layer is 20 μm or more, and the maximum impurity concentration of the first conductivity type buffer layer is higher than the maximum impurity concentration of the first conductivity type field-stop layer at $6\times10^{15}$ cm$^{-3}$ or more, and one-tenth or less of the maximum impurity concentration of the second conductivity type collector layer.

Also, the semiconductor device according to the first aspect of the invention is characterized in that the maximum impurity concentration of the second conductivity type collector layer is $6\times10^{16}$ cm$^{-3}$ or more, $1\times10^{20}$ cm$^{-3}$ or less. Also, the semiconductor device according to the first aspect of the invention is characterized in that the dopant of the first conductivity type field-stop layer is selenium or sulfur.

Also, the semiconductor device according to the first aspect of the invention is characterized in that the dopant of the first conductivity type buffer layer is phosphorus. Also, the semiconductor device according to the first aspect of the invention is characterized in that the maximum impurity concentration of the first conductivity type field-stop layer is $3\times10^{14}$ cm$^{-3}$ or more, $3\times10^{15}$ cm$^{-3}$ or less.

Also, the semiconductor device according to the first aspect of the invention is characterized in that the size of the concentration gradient of the first conductivity type field-stop layer becomes gradually smaller from the position of the maximum impurity concentration of the first conductivity type field-stop layer toward the one main surface side of the first conductivity type semiconductor substrate. Also, the semiconductor device according to the first aspect of the invention is characterized in that the rated voltage is 1,200V or higher.

Also, in order to solve the heretofore described problems, and to achieve the objects of the invention, a semiconductor device manufacturing method according to an eighth aspect of the invention is a method of manufacturing a semiconductor device including a first conductivity type drift layer formed of a first conductivity type semiconductor substrate, a MOS gate structure formed of at least a gate electrode, a gate dielectric film, and the first conductivity type semiconductor substrate provided on one main surface side of the first conductivity type semiconductor substrate, a second conductivity type collector layer provided on the other main surface of the first conductivity type semiconductor substrate, a first conductivity type field-stop layer provided between the first conductivity type drift layer and second conductivity type collector layer and having an impurity concentration higher than that of the first conductivity type drift layer, and a first conductivity type buffer layer provided between the first conductivity type field-stop layer and second conductivity type collector layer and having an impurity concentration higher than that of the first conductivity type field-stop layer, and has the following characteristics. Firstly, the MOS gate structure is formed on the one main surface side of the first conductivity type semiconductor substrate (a MOS gate structure formation step). Next, the other main surface of the first conductivity type semiconductor substrate is ground to reduce the first conductivity type semiconductor substrate to a predetermined thickness (a substrate thinning step). Next, dopants are ion implanted into the ground surface of the first conductivity type semiconductor substrate in order to form each of the first conductivity type field-stop layer, first conductivity type buffer layer, and second conductivity type collector layer (an implantation step). Next, heat treatment for simultaneously electrically activating the plurality of dopants ion implanted into the ground surface of the first conductivity type semiconductor substrate is carried out (an activation step). Next, a metal electrode film is formed by sputtering on the one main surface of the first conductivity type semiconductor substrate and carrying out heat treatment (an electrode film formation step).

Also, the semiconductor device manufacturing method according to the eighth aspect of the invention is characterized in that the implantation step and activation step are carried out so that the net doping concentration of the first conductivity type field-stop layer is higher than the net doping concentration of the first conductivity type drift layer, the total of the net doping concentration of the first conductivity type field-stop layer and net doping concentration of the first conductivity type drift layer has a value such that a depletion layer end of a depletion layer spreading in the first conductivity type drift layer and first conductivity type field-stop layer in response to an application of a rated voltage is inside the first conductivity type field-stop layer, the impurity concentration distribution of the first conductivity type field-stop layer has a concentration gradient that decreases from the other main surface side of the first conductivity type semiconductor substrate toward the one main surface side, the depth of the first conductivity type field-stop layer is 20 μm or more, and the maximum impurity concentration of the first conductivity type buffer layer is higher than the maximum impurity concentration of the first conductivity type field-stop layer at $6 \times 10^{15}$ cm$^{-3}$ or more, and one-tenth or less of the maximum impurity concentration of the second conductivity type collector layer.

According to the invention, the amount of holes implanted from the collector side when a short circuit occurs increases, and the rise of a magnetic field intensity on the collector side is suppressed, by forming a first conductivity type field-stop layer that is deep and of a low impurity concentration, and that has a gentle concentration gradient, using selenium or sulfur as a dopant. Also, by providing a first conductivity type buffer layer having a predetermined peak impurity concentration between the first conductivity type field-stop layer and a second conductivity type collector layer using an ion implantation of phosphorus, it is possible to suppress an implantation of holes contributing to an increase in leakage current. Also, according to the invention, it is possible to reduce on-state voltage variation by arranging that the peak impurity concentration of the first conductivity type buffer layer is at least one digit lower than the peak impurity concentration of the second conductivity type collector layer.

According to the semiconductor device and semiconductor device manufacturing method according to the invention, an advantage is achieved in that it is possible to balance improving resistance to element destruction by spreading a space-charge region at an early stage when a short circuit occurs with suppressing thermal runaway destruction caused by an implantation of holes. Also, according to the semiconductor device and semiconductor device manufacturing method according to the invention, an advantage is achieved in that it is possible to reduce variation in on-state voltage.

DETAILED DESCRIPTION

Hereafter, referring to the attached drawings, a detailed description will be given of a preferred embodiment of a semiconductor device and semiconductor device manufacturing method according to the invention. The invention is not limited to the description in the examples to be described hereafter, provided that the scope of the invention is not exceeded. In the description and attached drawings, a layer or region being prefixed by n or p indicates that electrons or holes respectively are majority carriers. In the description below, a description is given with a first conductivity type as an n-type and a second conductivity type as a p-type, but the invention is established in the same way when the first conductivity type is a p-type and the second conductivity type an n-type. Also, + or − being added to n or p indicates a higher impurity concentration or lower impurity concentration respectively than that in a layer or region to which neither is added. Also, an impurity determining whether a semiconductor is a p-type or an n-type is also called a dopant. An impurity concentration indicates a net doping concentration resulting from an electrically activated dopant, unless specifically indicated otherwise. The same reference signs are given to the same configurations in the following embodiment description and attached drawings, and redundant descriptions are omitted.

Embodiment

Figure 1:
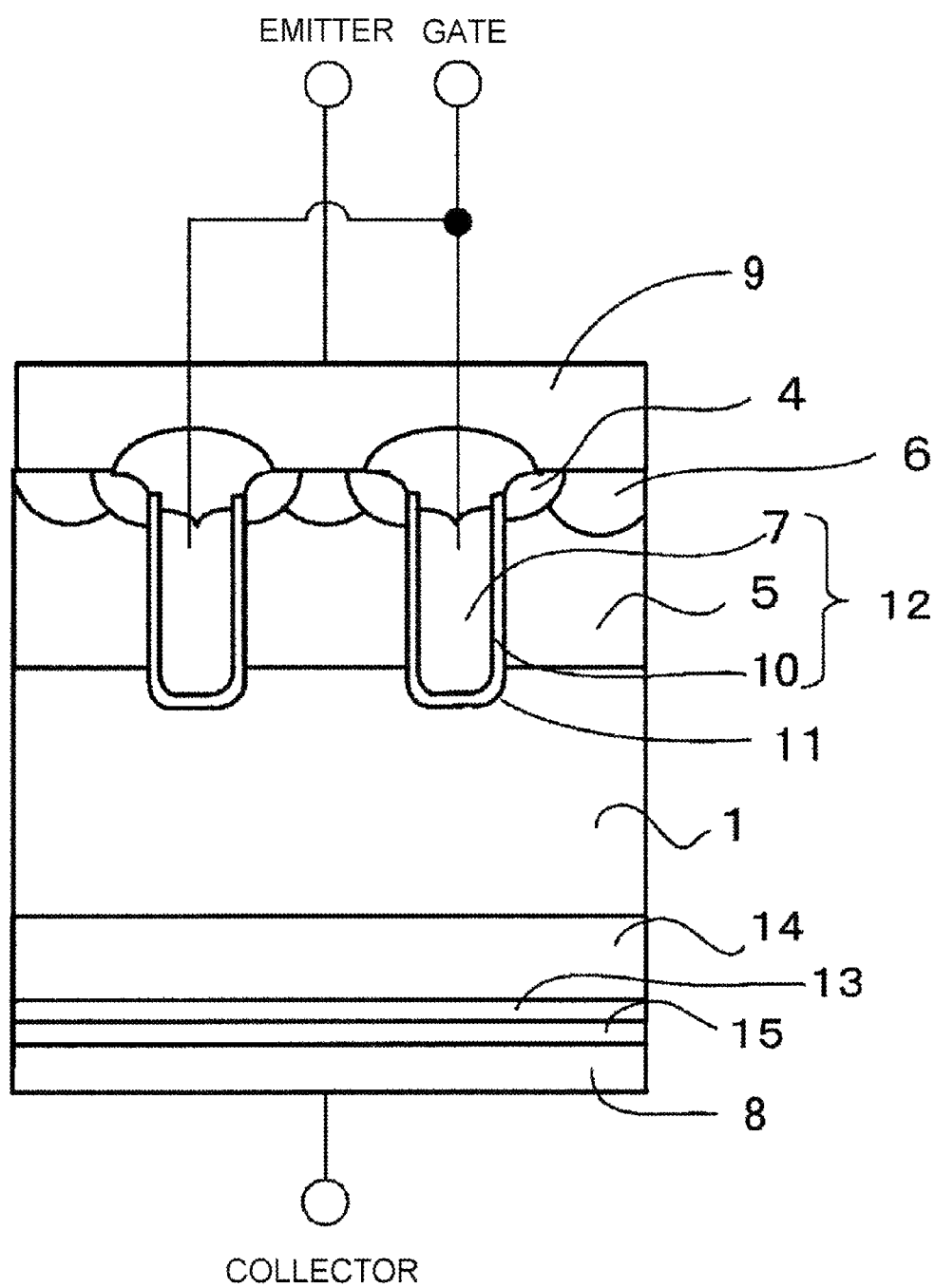
FIG. 1 is a main portion sectional view showing the configuration of an FS-IGBT according to an embodiment of the invention.
Figure 6:
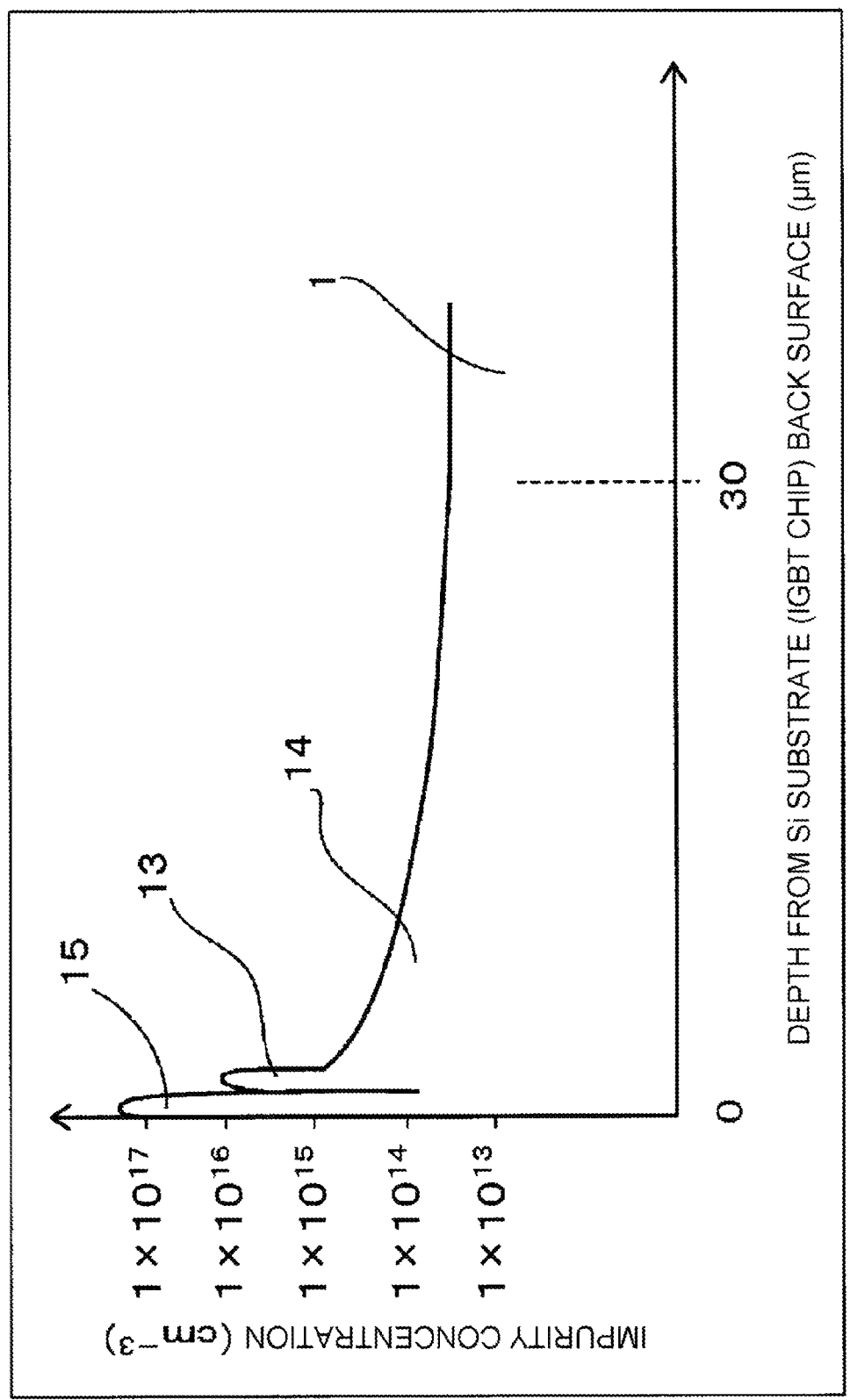
FIG. 6 is a characteristic diagram showing the impurity concentration distribution of the FS-IGBT according to the embodiment of the invention.

A field-stop IGBT (FS-IGBT) according to an embodiment of the invention will be described in detail with reference to FIGS. 1, 6 and the like, with a trench-FS-IGBT with a breakdown voltage of, for example, 1,700V as an example. FIG. 1 is a main portion sectional view showing the configuration of the FS-IGBT according to the embodiment of the invention. FIG. 6 is a characteristic diagram showing the impurity concentration distribution of the FS- IGBT according to the embodiment of the invention. FIG. 6 shows the impurity concentration distribution from the back surface to an n⁻ type drift layer 1 of a silicon (Si) substrate (semiconductor substrate) configuring the trench-FS-IGBT (the same also applies to FIG. 7).

The trench-FS-IGBT shown in FIG. 1 is configured using, for example, an FZ-n-type Si substrate formed of an inexpensive FZ wafer. The resistivity of the Si substrate may be in the region of, for example, 80 Ωcm to 13 Ωcm. The thickness of the finished Si substrate may be in the region of, for example, 160 μm to 210 μm. The thickness of the finished Si substrate is the thickness of the Si substrate configuring the product after the FS-IGBT is completed. The layer structure inside the Si substrate is as follows. A plurality of trenches 11 are provided at predetermined intervals in one main surface (the front surface) of the Si substrate, which forms the n⁻ type drift layer 1.

Inside the trench 11, a gate dielectric film 10 is provided along the inner wall of the trench 11, and a gate electrode 7 is provided on the inner side of the gate dielectric film 10. A p-type base layer 5 is provided in portions of the Si substrate sandwiched between the trenches 11, whereby a trench MOS gate (an insulated gate formed of a metal-oxide film-semiconductor) structure (trench MOS structure) 12 formed of the gate electrode 7, gate dielectric film 10, p-type base layer 5, and the like is configured on the front surface side of the Si substrate. An n⁺ type emitter region 4 and p⁺ contact region 6 are selectively provided in a surface layer of each p-type base layer 5 among the plurality of trenches 11.

The n⁺ type emitter region 4 is disposed so as to be in contact with the upper side (aperture portion side) end of a side surface of the trench 11. The p⁺ contact region 6 is disposed so as to be in contact with the n⁺ type emitter region 4. An emitter electrode 9 is provided forming ohmic contact to the surface of the n⁺ type emitter region 4 and the surface of the p-type base layer 5 (or with the p⁺ contact region 6 in the surface layer of the p-type base layer 5). The emitter electrode 9 is electrically insulated from the gate electrode 7 by an interlayer dielectric film. A p⁺ type collector layer 15 and a collector electrode 8 forming ohmic contact to the surface of the p⁺ type collector layer 15 are provided on the back surface (other main surface) side of the Si substrate.

An n-type layer structure formed of an n⁺ type buffer layer 13 having a peak impurity concentration (maximum impurity concentration of the impurity concentration distribution) peculiar to the invention and an n-type field-stop (FS) layer 14 deep toward the n⁻ type drift layer 1 side via the n⁺ type buffer layer 13 is configured as a characteristic of the invention on the n⁻ type drift layer 1 side of the p⁺ type collector layer 15. The impurity concentration distribution of the p⁺ type collector layer 15, n⁺ type buffer layer 13, n-type FS layer 14, and n⁻ type drift layer 1 in the depth direction from the back surface of the Si substrate (or an IGBT chip) is shown in FIG. 6.

It is preferable that, for example, selenium or sulfur, which have a higher diffusion coefficient than that of phosphorus at the same temperature, is used as an ion implantation dopant for forming the n-type FS layer 14, and more preferable that selenium is used. It is preferable that the maximum impurity concentration of the n-type FS layer 14 is within a range of, for example, $3\times10^{14}$ cm⁻³ to $3\times10^{15}$ cm⁻³. It is preferable that the diffusion depth of the n-type FS layer 14 is such that the interface of the n-type FS layer 14 and n⁻ type drift layer 1 is within a range of, for example, 20 μm or more, 40 μm or less from the back surface of the Si substrate. An ion implantation of, for example, selenium for forming the n-type FS layer 14, and a subsequent thermal diffusion process, are carried out under conditions within these kinds of maximum impurity concentration and diffusion depth ranges. For example, the depth from the back surface of the Si substrate to the interface of the n-type FS layer 14 and n⁻ type drift layer 1 may be 30 μm. In this case, the impurity concentration distribution from the back surface of the Si substrate to a depth of 30 μm has a concentration gradient such that an n-type impurity concentration exhibits the highest value (for example, $3\times10^{15}$ cm⁻³) in the vicinity of the Si substrate back surface side surface, and the n-type impurity concentration becomes lower the deeper in the depth direction from the Si substrate back surface side.

Firstly, in order to prevent thermal runaway destruction of the element, the impurity concentration and diffusion depth from the Si substrate back surface of a portion of the n-type FS layer 14 having the maximum impurity concentration are such that the total value of the total impurity of the n-type FS layer 14 and total impurity of the n⁻ type drift layer 1 at least satisfies the following relationship. When a rated voltage is applied to the FS-IGBT in an off-state wherein a zero voltage or negative voltage is applied to the gate electrode 7, a depletion layer spreads in the n⁻ type drift layer 1 and n-type FS layer 14. At this time, the total value of the total impurity of the n-type FS layer 14 and total impurity of the n⁻ type drift layer 1 in the depletion layer is a value such that a leading end portion of the depletion layer (a depletion layer end) is inside the n-type FS layer 14, that is, a value sufficient that the spread of the depletion layer is stopped inside the n-type FS layer 14. Herein, the total impurity (or impurity total) is a value wherein the impurity concentration of a certain layer is integrated in a depth direction (a direction headed perpendicularly from the front surface of the semiconductor substrate toward the back surface, or a direction the opposite thereof).

Specifically, the total value of the total impurity of the n-type FS layer 14 and total impurity of the n⁻ type drift layer 1 in the depletion layer is the total value, in the region in which the depletion layer spreads, of a value of the impurity concentration of the n⁻ type drift layer 1 from the position (depth) of the p-n junction between the p-type base layer 5 and n⁻ type drift layer 1 to the position of the interface between the n⁻ type drift layer 1 and n-type FS layer 14 integrated in the depth direction and the value of the impurity concentration of the n-type FS layer 14 from the position in which the n⁻ type drift layer 1 and n-type FS layer 14 intersect to the position of the depletion layer edge integrated in the depth direction. Furthermore, it is arranged that the depletion layer end of the depletion layer spreading when the rated voltage is applied does not reach the p⁺ type collector layer 15, and that there is a certain distance (for example, 3 μm or more) between the p⁺ type collector layer 15 and depletion layer end. By maintaining distance between the p⁺ type collector layer 15 and depletion layer end in this way, it is possible to suppress an implantation of holes into the depletion layer. In order to prevent thermal runaway destruction of the element, as heretofore described, it is firstly important to suppress an implantation of holes into the depletion layer occurring when voltage is applied to the element in an off-state wherein a zero voltage or negative voltage is applied to the gate electrode 7. In order to do this, it is preferable at least that the depletion layer end when the rated voltage is applied is inside the n-type FS layer 14.

By providing the n-type FS layer 14, which is deep in the depth direction from the Si substrate back surface and which has a concentration gradient such that the impurity concentration becomes gradually lower from the p⁺ type collector layer 15 side in the depth direction from the back surface, it is possible to alleviate the electrical field intensity attenuation rate of the electrical field intensity distribution of the depletion layer end spreading when the rated voltage is applied. Because of this, the n-type FS layer 14 has functions of suppressing voltage waveform or current waveform oscillation liable to occur when turning off, and reducing voltage waveform or current waveform amplitude. Also, when forming the n-type FS layer 14, the following advantages are obtained by forming a diffusion layer with a depth of 20 µm or more, which is to become the n-type FS layer 14, using selenium or sulfur as a dopant. When ion implanting a dopant into a semiconductor substrate (wafer), it may happen that particles of in the region of a few micrometers in size existing in the implantation surface form an ion implantation shadow that blocks ions, whereby a defect region into which ions are not implanted is formed inside the semiconductor substrate. By forming a diffusion layer with a depth of 20 µm or more, which is to become the n-type FS layer 14, using selenium or sulfur as a dopant, as in the invention, the dopant diffuses to a depth a few times greater than the size of the particles. Because of this, owing to a lateral diffusion (a diffusion in a direction perpendicular to the substrate depth direction) of the selenium or sulfur, the dopant also diffuses to the region to which ion implantation is blocked by the particles. Consequently, it is possible to reduce ion implantation unevenness occurring because of the particles to an extent such that characteristics such as breakdown voltage and leakage current do not depreciate. Furthermore, it is possible to reduce the peak impurity concentration of the selenium used as the ion implantation dopant beyond that of the phosphorus used as a dopant for a heretofore known ion implantation. As a result of this, the amount of holes implanted from the collector side when a short circuit occurs increases, and a rise in the electrical field intensity on the collector side is suppressed. Consequently, it is possible to prevent element destruction when a short circuit occurs.

Furthermore, as will be described hereafter, the invention is of a configuration such that, in addition to the deep n-type FS layer 14 being formed by a selenium ion implantation, the n⁺ buffer layer 13 formed by a phosphorus ion implantation peculiar to the invention is provided between the n-type FS layer 14 and p⁺ collector layer 15. As will be described hereafter, it is preferable that the n-type FS layer 14 impurity concentration has a lower overall concentration gradient, as with selenium, in order to prevent element destruction when a short circuit occurs. The reason for this is as follows. When the impurity concentration of the n-type FS layer 14 is such that the depletion layer end when the rated voltage is applied with the gate in an off-state is inside the n-type FS layer 14, as previously described, the peak impurity concentration of the n-type FS layer 14 in the vicinity of the p⁺ type collector layer 15 also decreases. Because of this, there is a problem in that the injection efficiency of holes from the p⁺ type collector layer 15 increases, the leakage current increases, and the possibility of thermal runaway destruction increases. By further providing the n⁺ buffer layer 13 between the n-type FS layer 14 and p⁺ collector layer 15 using a phosphorus ion implantation, as in the case of the invention, it is possible to suppress an implantation of holes contributing to an increase in leakage current. Other than phosphorus, it is also possible to use arsenic (As) in the n⁺ buffer layer 13. Also, as well as using selenium, it is also possible to use sulfur as the n-type impurity forming the n-type FS layer 14, as previously described.

Figure 3:
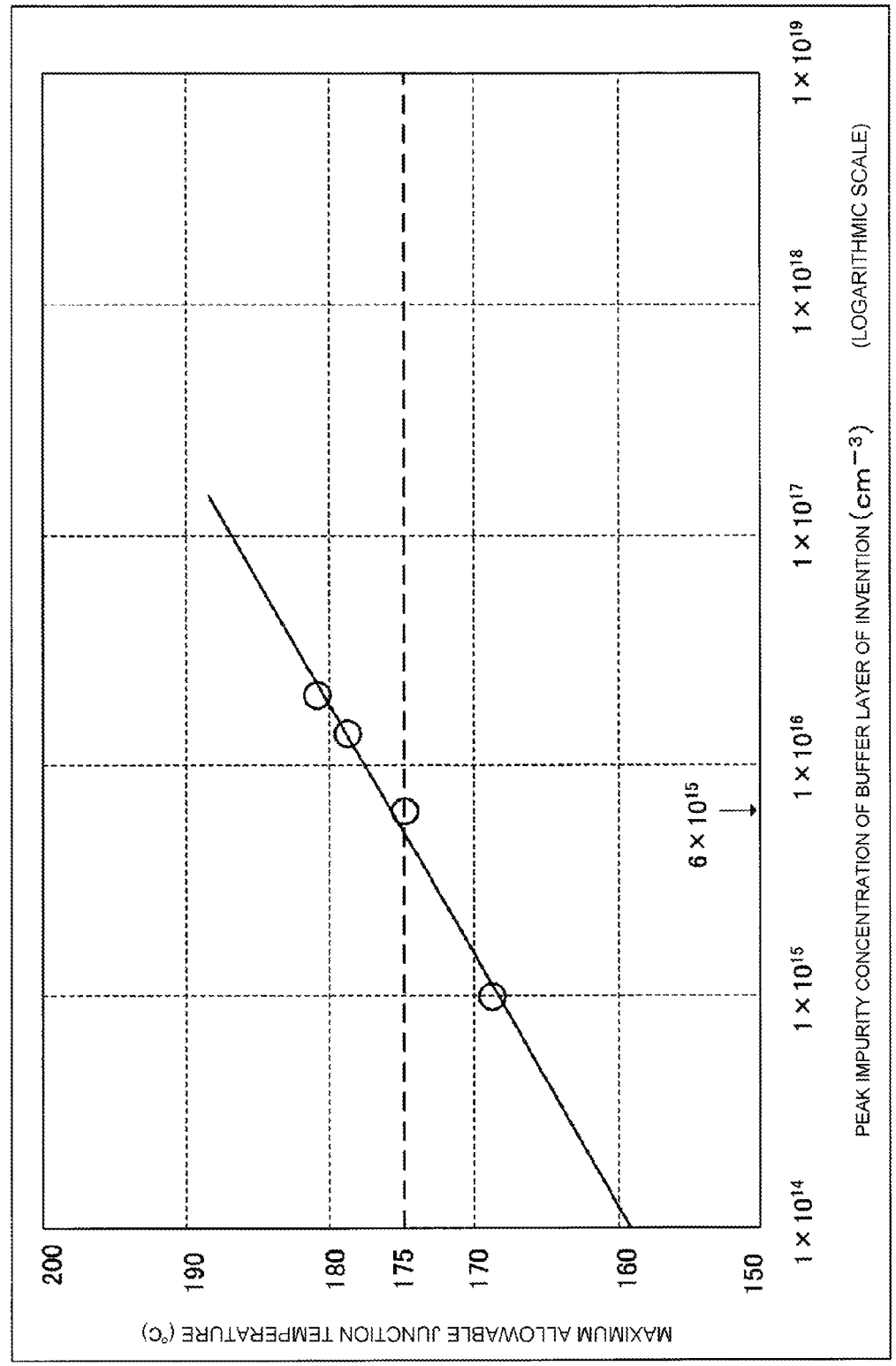
FIG. 3 is a characteristic diagram showing the relationship between the peak impurity concentration and maximum allowable junction temperature of a buffer layer of the FS-IGBT according to an embodiment of the invention.

It is preferable that the n⁺ buffer layer 13, for example, has a thickness of 0.5 µm to 3.0 µm, that the peak impurity concentration is at least $6 \times 10^{15}$ cm⁻³ or more, and that the n⁺ buffer layer 13 is formed by a phosphorus ion implantation so as to have a small peak impurity concentration one-tenth or less that of the peak impurity concentration of the p⁺ collector layer 15. Firstly, a description will be given, referring to FIG. 3, of the reason that it is preferable that the peak impurity concentration of the n⁺ buffer layer 13 is $6 \times 10^{15}$ cm⁻³ or more. FIG. 3 is a characteristic diagram showing the relationship between the peak impurity concentration (cm⁻³) and maximum allowable junction temperature (° C.) of the buffer layer of the FS-IGBT according to the invention. The maximum allowable junction temperature is the maximum junction temperature allowed in the p-n junction portion between the n⁺ buffer layer 13 and p⁺ collector layer 15 (hereafter referred to as the maximum allowable junction temperature). The n⁺ buffer layer 13 has a function of suppressing the implantation of holes from the p⁺ type collector layer 15. When the peak impurity concentration of the n⁺ buffer layer 13 is $6 \times 10^{15}$ cm⁻³ or more, the maximum allowable junction temperature is 175° C. or higher, as shown in FIG. 3. The maximum guaranteed operating temperature when actually using the element is a temperature guaranteeing that thermal runaway due to leakage current (positive feedback whereby a temperature rise caused by leakage current causes a further increase in leakage current) does not occur at that temperature or lower, and is normally 175° C. Consequently, thermal runaway due to leakage current should not occur at or below the maximum guaranteed operating temperature. From the results shown in FIG. 3, it is seen that, in order to prevent thermal runaway at 175° C., it is good when the peak impurity concentration of the n⁺ buffer layer 13 is $6 \times 10^{15}$ cm⁻³ or more.

Figure 4:
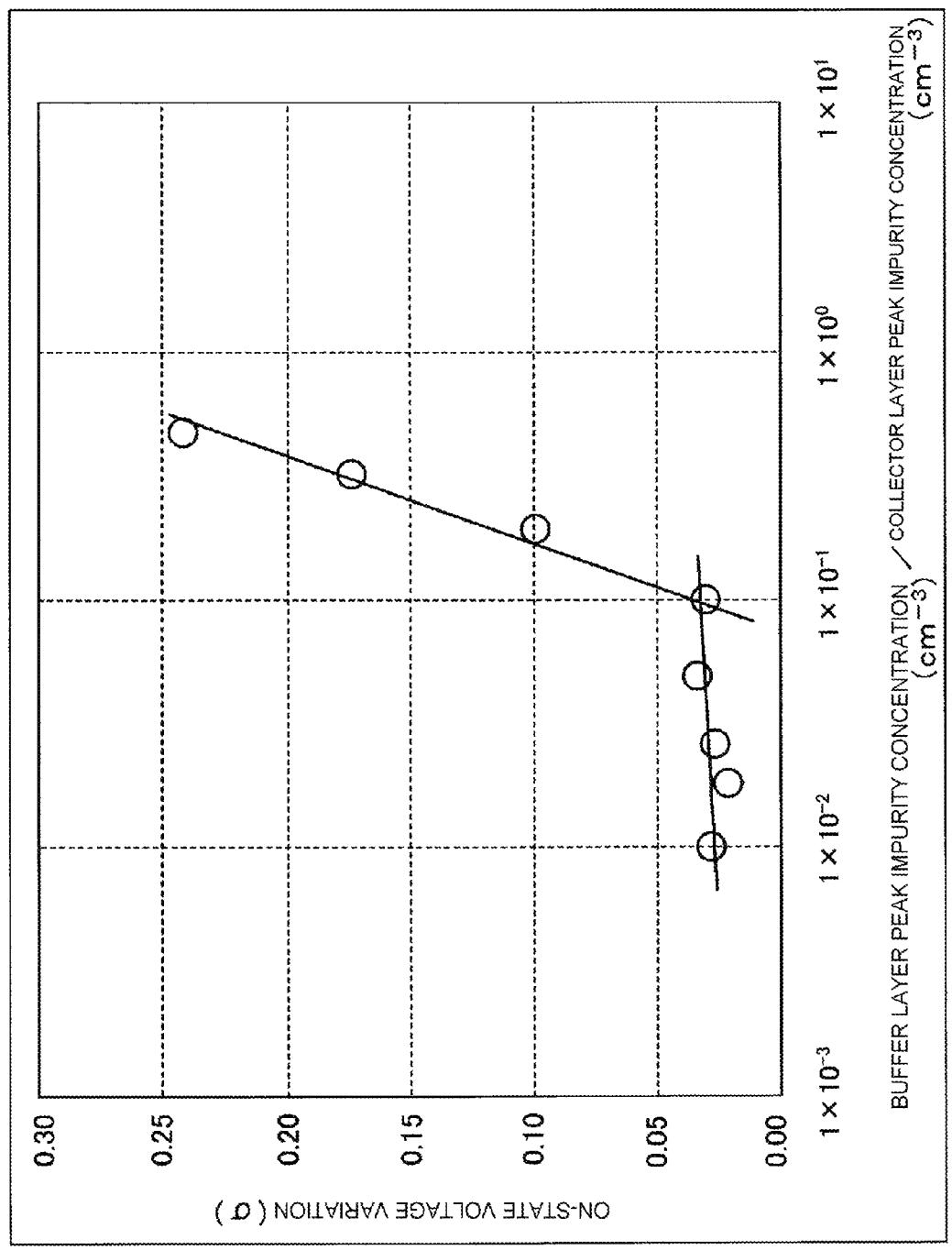
FIG. 4 is a characteristic diagram showing on-state voltage variation according to the ratio between the peak impurity concentration of the buffer layer of the FS-IGBT according to an embodiment of the invention and the peak impurity concentration of a collector layer.
Figure 5:
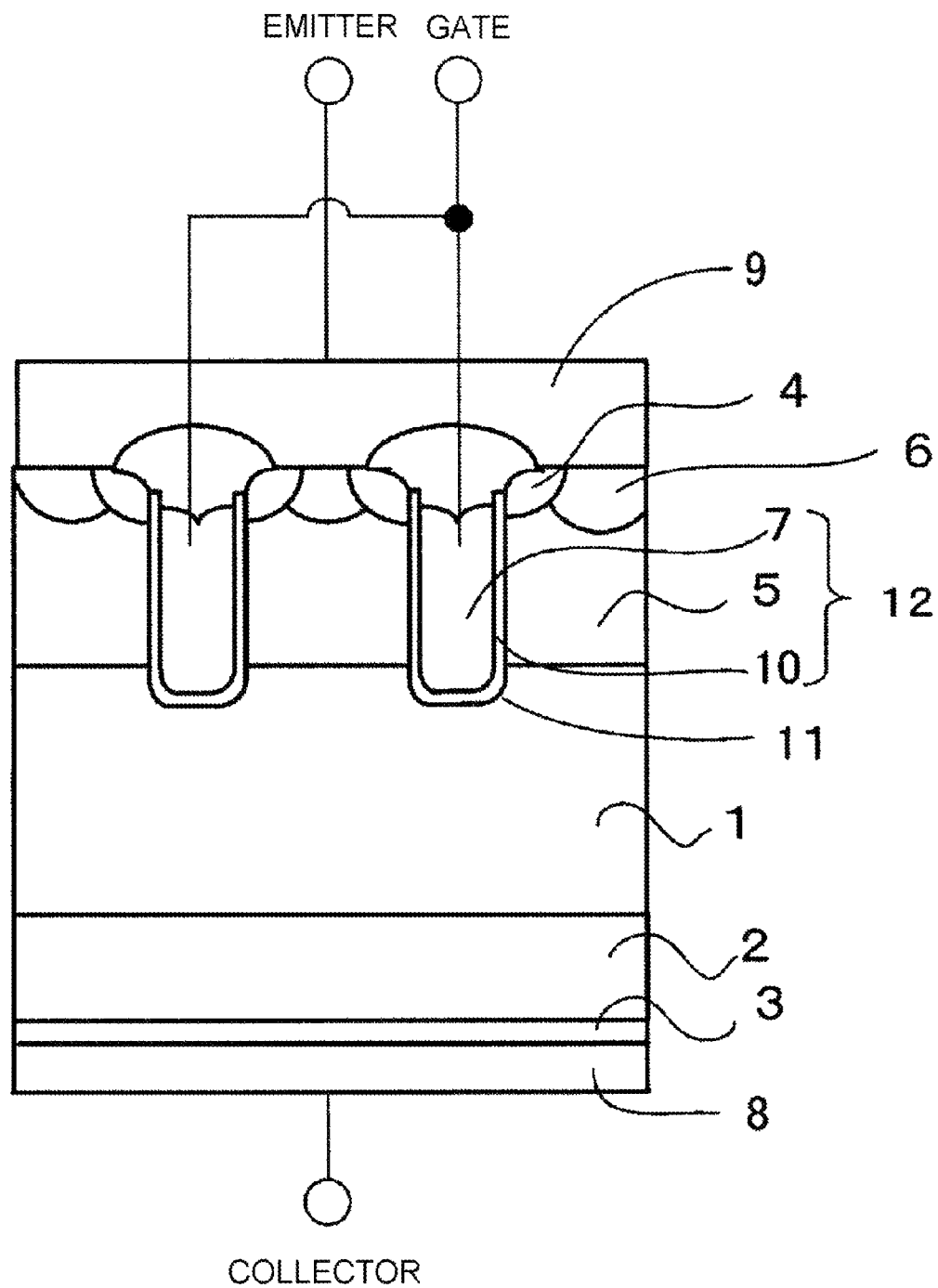
FIG. 5 is a main portion sectional view showing the configuration of a heretofore known FS-IGBT.

Next, a description will be given, referring to FIG. 4, of the reason that it is preferable that the peak impurity concentration of the n⁺ buffer layer 13 is less than the peak impurity concentration of the p⁺ type collector layer 15. FIG. 4 is a characteristic diagram showing on-state voltage variation according to the ratio between the peak impurity concentration of the buffer layer of the FS-IGBT according to the invention and the peak impurity concentration of the collector layer. The variation in an on-state voltage (Von) is determined by the ratio between the peak impurity concentration of the n⁺ buffer layer 13 and the peak impurity concentration of the p⁺ type collector layer 15 (=the peak impurity concentration of the n⁺ buffer layer 13/the peak impurity concentration of the p⁺ type collector layer 15). As shown in FIG. 4, it can be seen that the variation in the on-state voltage (Von) can be reduced by arranging that the peak impurity concentration of the n⁺ buffer layer 13 is at least one digit lower than the peak impurity concentration of the p⁺ type collector layer 15. As a result of this, the efficiency rate is improved. It has been confirmed above, from the results shown in FIGS. 3 and 4, that it is preferable that the peak impurity concentration of the n⁺ buffer layer 13 is $6 \times 10^{15}$ cm⁻³ or more, and is at least one digit lower than the peak impurity concentration of the p⁺ type collector layer 15.

It is also widely known that it is necessary that there is a good trade-off relationship between the turn-off loss of the FS-IGBT and the on-state voltage. In order to achieve this, it is good that the maximum impurity concentration (peak impurity concentration) of the p⁺ type collector layer 15 is within a range of $6 \times 10^{16}$ cm$^{-3}$ or more, $1 \times 10^{20}$ cm$^{-3}$ or less, and preferably within a range of $6 \times 10^{16}$ cm$^{-3}$ or more, $1 \times 10^{18}$ cm$^{-3}$ or less, for example, $1 \times 10^{17}$ cm$^{-3}$. That is, the p⁺ type collector layer 15 has a function as a low implantation collector with low hole injection efficiency, and needs to be formed with a surface impurity concentration that is a peak impurity concentration ten times or more higher than the peak impurity concentration of the n⁺ buffer layer 13, as heretofore described, and that forms an ohmic contact to the collector electrode 8. Meanwhile, a power conversion device using an FS-IGBT as a switching element is such that the on-state voltage of the IGBT may be reduced as far as possible for a special application such that gives priority to reducing conduction loss rather than switching loss. In this kind of case, for example, it is good when the maximum impurity concentration of the p⁺ type collector layer 15 is within a range of $1 \times 10^{18}$ cm$^{-3}$ or more, $1 \times 10^{20}$ cm$^{-3}$ or less, and the peak impurity concentration is ten times or more higher than the peak impurity concentration of the n⁺ buffer layer 13.

Next, a description will be given of how the high breakdown voltage FS-IGBT according to the embodiment of the invention has an advantage of preventing element destruction when a short circuit occurs. Generally, when a short circuit occurs in a circuit in which an FS-IGBT is used, the gate may be turned on in a condition wherein the power supply voltage is applied to the IGBT. At this time, an excessive saturation current determined by the difference between the MOS gate threshold voltage and gate electrode voltage, that is, a short circuit current, is generated in the IGBT. The interior of the IGBT generates heat because of power loss in accordance with the product of the short circuit current and power supply voltage, and the element is destroyed. Because of this, it is often the case that a protection circuit that detects an occurrence of a short circuit in the IGBT by monitoring the temperature or the like of the IGBT, and applies reverse bias to the gate in order to turn the IGBT off safely, is used in a power conversion device such as an inverter in order to protect the IGBT from a shorting of the circuit. However, it is unavoidable that a short circuit current flows into the IGBT for a time in the order of microseconds until the turning off by the gate becomes effective and the short circuit current is completely shut off. When this short circuit current, for example, a short circuit current of in the region of 20 times the rated current, flows into the IGBT, the amount of electrons implanted from the MOS gate of the IGBT into the drift layer is extremely large. Because of this, the minority carriers and majority carriers on the surface side of the drift layer are equivalently neutralized, and the condition is such that the size of the drift layer space-charge density drops noticeably to in the region of the drift layer dopant impurity concentration or lower. For example, in an FS-IGBT with a high breakdown voltage of 1,700V or more, a short circuit current occurring while the FS-IGBT is being used at a sufficiently high gate voltage corresponds to the previously described kind of case wherein the amount of electrons implanted into the drift layer is extremely large, to the extent that the size of the drift layer space-charge density drops.

Figure 2:
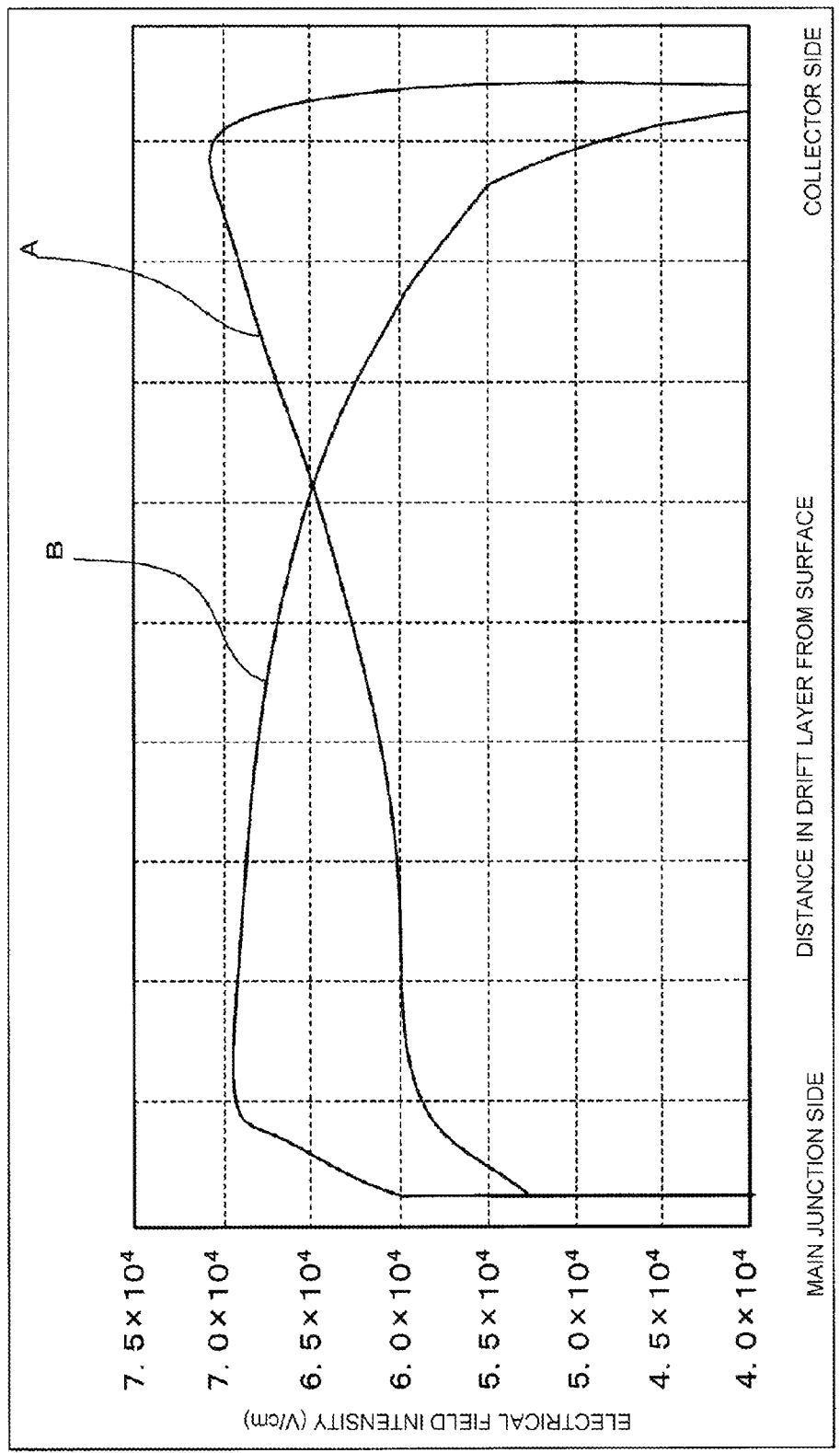
FIG. 2 is a characteristic diagram showing the electrical field intensity distribution in a drift layer of the FS-IGBT according to the embodiment of the invention when a short circuit occurs.

With regard to the electrical field intensity distribution in the drift layer when the previously described short circuit current flows, a description will be given, with reference to FIG. 2, of the difference in waveforms of the FS-IGBT according to the embodiment of the invention and a heretofore known high breakdown voltage FS-IGBT obtained from a device simulation. FIG. 2 is a characteristic diagram showing the electrical field intensity distribution in the drift layer of the FS-IGBT according to the embodiment of the invention when a short circuit occurs. The electrical field intensity distribution of the heretofore known high breakdown voltage FS-IGBT is shown by a waveform A. The electrical field intensity distribution in the drift layer of the heretofore known high breakdown voltage FS-IGBT is such that, at a normal off-state voltage, a peak of a high electrical field intensity occurs on a main junction (the p-n junction between the p-type base layer and drift layer) side of the FS-IGBT. Also, when a short circuit current flows, the condition is such that the drift layer space-charge density drops noticeably due to the implantation of a large amount of electrons, as previously described, and the polarity thereof is inverted from positive to negative. As a result thereof, the electrical field intensity on the main junction side drops and is smoothed, the electron concentration in a region on the collector layer side of a space-charge region becomes extremely high, and a peak (maximum) electrical field intensity higher than that on the main junction side is exhibited, as in the waveform A. When the electrical field intensity exceeds an electrical field intensity (a critical electrical field intensity) such that causes a unique dielectric breakdown to occur in the silicon semiconductor, an avalanche breakdown occurs on the side of the buffer layer nearer to the collector junction, and the possibility of the element being destroyed arises.

When investigating FS-IGBTs having a low implantation collector layer with regard to the conditions under which this kind of short circuit related destruction occurs, it is found that, for example, the higher the total impurity of an FS layer between the drift layer and collector layer in an FS-IGBT, the more likely destruction is to occur. Therefore, it has been confirmed that the short circuit related destruction is reduced with the invention by adopting a layer configuration such that the total impurity of the n-type FS layer 14 is reduced so that, as well as an implantation of a large amount of electrons from the MOS gate, the amount of holes implanted from the p⁺ type collector layer 15 is increased when the short circuit current flows. An analysis of a short circuiting operation created by a device simulation has been carried out for an FS-IGBT having this layer configuration. The electrical field intensity distribution of the FS-IGBT according to the embodiment of the invention is shown by a waveform B in FIG. 2. As a result of this, it is seen that the electrical field intensity distribution when a short circuit current flows is such that the electrical field intensity on the collector side is sufficiently small in comparison with the heretofore known waveform A, as shown by the waveform B in FIG. 2. The reason for this can be supposed to be as follows. By reducing the total impurity of the n-type FS layer 14 and the p⁺ type collector layer 15 side of the n⁻ type drift layer 1 in comparison with that of the heretofore known FS-IGBT, it is easier for the depletion layer to extend to the collector side when a high voltage is applied. As a result of this, the effective n-type base width of a pnp transistor formed of the p⁺ type collector layer 15, n⁻ type drift layer 1 and n-type FS layer 14, and p-type base layer 5 decreases, because of which the carrier transportation efficiency increases, and the amount of holes implanted from the p⁺ type collector layer 15 increases. As the holes, which are a positive charge, implanted from the p⁺ type collector layer 15 counterbalance the electrons, which are a negative charge, implanted from the emitter side, the space-charge region spreads, and the voltage that can be supported by the n⁻ type drift layer 1 and n-type FS layer 14 increases. As a result of this, the electrical field on the back surface side is alleviated, as in the waveform B, and the occurrence of an avalanche breakdown is prevented.

Increasing the amount of holes implanted from the p+ type collector layer 15 when there is a short circuit means spreading the space-charge region as quickly as possible after the occurrence of the short circuit, reducing the width of a charge-neutral region remaining between the space-charge region and the p+ type collector layer 15 in a short time, and bringing an effective current amplification rate a sufficiently close to 1. When there is a short circuit, the space-charge region spreads in the n− type drift layer 1 and n-type FS layer 14 from the position of the p-n junction between the p-type base layer 5 and n− type drift layer 1 toward the p+ type collector layer 15. At this time, a large amount of electrons are supplied from the MOS gate, as previously described, because of which the electrons and holes, which are carriers, are counterbalanced, the size of the space-charge density becomes sufficiently small, and the space-charge region reaches a state of high resistance. Meanwhile, the position of the leading end portion of the space-charge region spreading from the n− type drift layer 1 to the n-type FS layer 14 is determined by the voltage applied to the element, and by a value wherein an electrical field intensity wherein the space-charge density in the depth direction of the Si substrate is integrated is further integrated. As the electrons and holes are counterbalanced when there is a short circuit, as previously described, the space-charge density distribution is acutely dependent on the impurity concentration (donor concentration) distribution of the n− type drift layer 1 and n-type FS layer 14, and particularly that of the n-type FS layer 14. That is, when the donor concentration of the n-type FS layer 14 becomes smaller in response to a certain applied voltage within a range such as not to fall below the donor concentration of the n− type drift layer 1, the integrated value of the space-charge density decreases, and the leading end portion of the space-charge region moves more deeply toward the p+ type collector layer 15. In particular, the space-charge region spreads more quickly in a transient period immediately after a short circuit occurs. Because of this, the amount of holes implanted from immediately after the occurrence of a short circuit increases, and an inversion of the polarity of the space-charge density is prevented.

From the investigations of the inventors, it has been confirmed that, when the maximum impurity concentration of the n-type FS layer 14 is $3 \times 10^{15}$ cm$^{-3}$ or less, it is possible to reduce the total impurity of the n-type FS layer 14 to an extent such as to achieve an advantage of spreading the space-charge region quickly immediately after the occurrence of a short circuit, as heretofore described. Furthermore, it is still more preferable that the maximum impurity concentration of the n-type FS layer 14 is less than $1 \times 10^{15}$ cm$^{-3}$, as the space-charge region is spread at an earlier stage immediately after the occurrence of a short circuit. By reducing the total impurity of the n-type FS layer 14 so as to increase the amount of holes implanted from the p+ type collector layer 15 in this way, the effective current amplification rate is increased, and the amount of holes implanted from the p+ type collector layer 15 increased, and it is thus possible to alleviate the electrical field intensity on the back surface side. As a result of this, the occurrence of avalanche breakdown is prevented, and it is possible to prevent short circuit destruction. In order to stop the depletion layer end inside the n-type FS layer 14 when the rated voltage is applied to the IGBT with the gate in an off-state, as previously described, it is good when the maximum impurity concentration of the n-type FS layer 14 is $3 \times 10^{14}$ cm$^{-3}$ or more.

Figure 7:
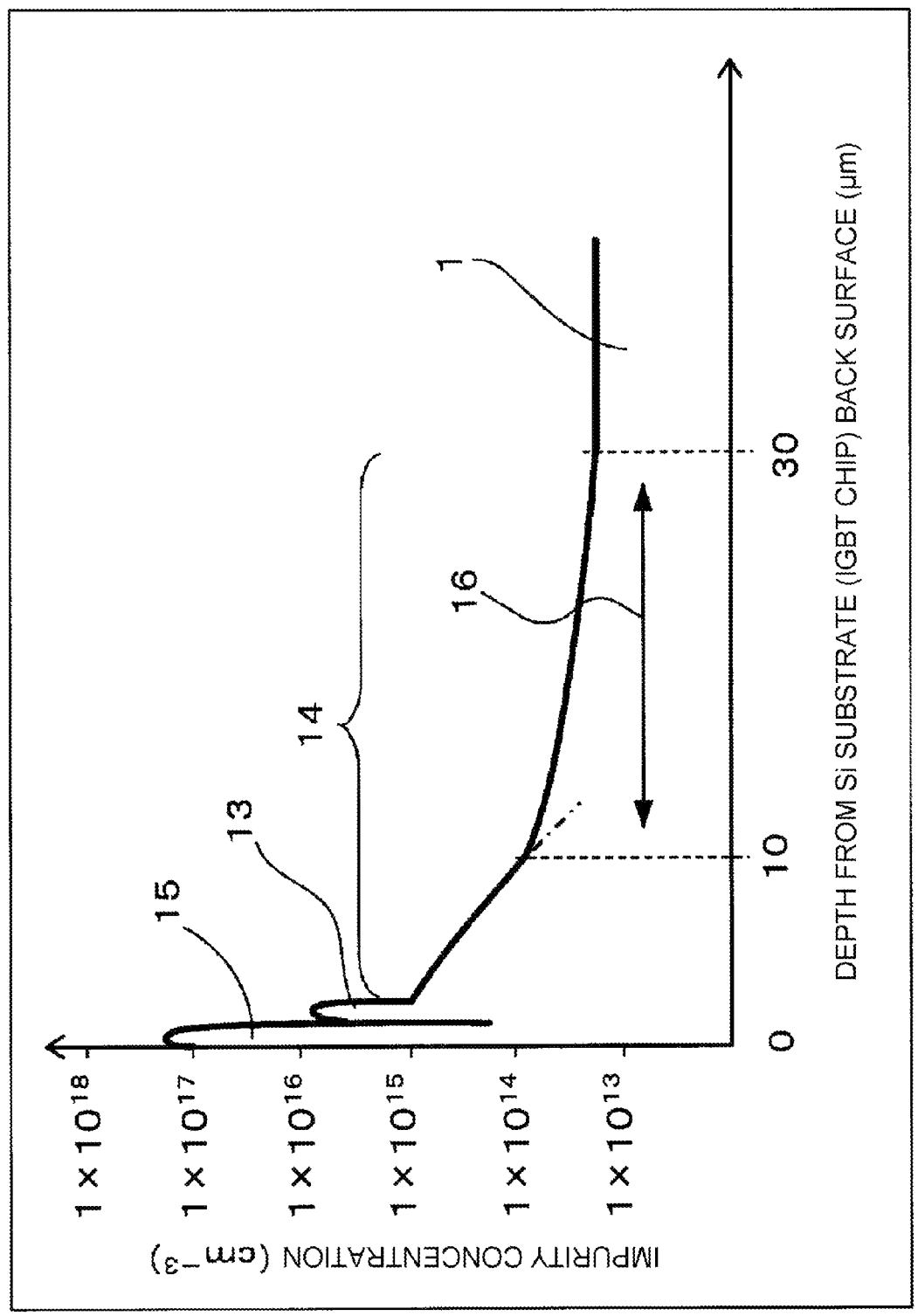
FIG. 7 is a characteristic diagram showing the impurity concentration distribution of the FS-IGBT according to an embodiment of the invention.

The advantage of spreading the space-charge region quickly after the occurrence of a short circuit is not only that the total impurity of the n-type FS layer 14 is reduced, as heretofore described, but also that a greater advantage is achieved when the impurity concentration distribution of the n-type FS layer 14 is also adapted. FIG. 7 is a characteristic diagram showing the impurity concentration distribution of the FS-IGBT according to the invention. Specifically, for example, it is good when a distribution function indicating the impurity concentration distribution of the n-type FS layer 14 is, rather than a Gauss function, an exponential function such that the decay of the spatial impurity concentration is steeper than in the case of a Gauss function. In the case of an exponential function, the decrease in the impurity concentration from the position of the maximum impurity concentration to a position in which the impurity concentration is one-half of the maximum impurity concentration is steeper than in the case of a Gauss function. In other words, the concentration gradient when moving from a position in which the impurity concentration is sufficiently small toward the position of the maximum impurity concentration is gentler in the case of an exponential function. That is, the concentration gradient when the impurity concentration of the n-type FS layer 14 increases from the interface between the n-type FS layer 14 and n− type drift layer 1 toward the p+ type collector layer 15 is gentler in the case of an exponential function distribution. Because of this, the heretofore described integrated value of the space-charge density decreases when a short circuit occurs, and it is thus possible to spread the space-charge region more quickly.

Even when the actual impurity concentration distribution of the n-type FS layer 14 is not exactly the exponential function distribution, it is sufficient that the decay of the impurity concentration from the maximum value is steeper than in the case of a Gauss function, and that the concentration gradient is gentle when the impurity concentration increases from the interface between the n-type FS layer 14 and n− type drift layer 1 toward the p+ type collector layer 15. It has been discovered by the inventors that, in order to realize this kind of n-type FS layer 14 impurity concentration distribution, it is preferable to use selenium or sulfur, which have a diffusion coefficient higher than that of the normally used phosphorus or arsenic, as the n-type dopant when forming the n-type FS layer 14 by thermal diffusion. The impurity concentration distribution obtained by thermal diffusion of the phosphorus or arsenic normally used as the n-type dopant is well expressed by a Gauss function. As opposed to this, it is clear that, as shown in FIG. 7, the impurity concentration distribution of the n-type FS layer 14 when selenium or sulfur is used as the n-type dopant is such that a so-called trailing portion (trailing portion 16) can be formed in a portion deeper than a position at a depth of in the region of 10 μm from the back surface of the Si substrate. The trailing portion 16 is a region such that, with a position at a depth of in the region of 10 μm from the back surface of the Si substrate (hereafter referred to simply as a border position) as a border, the size of the concentration gradient in a portion deeper than the border portion (as far as a depth of in the region of 30 μm, which is the border with the n− type drift layer 1) gradually (or non-continuously) becomes smaller and gentler than the concentration gradient from the position of the maximum impurity concentration of the n-type FS layer 14 to the border position. When comparing with the size of the concentration gradient of the extension line formed by the dash-dot line in FIG. 7, it is seen that the concentration gradient of the trailing portion 16 is of a smaller size. The trailing portion 16 is particularly noticeable in the case of selenium, and is a structure that is not seen in the impurity concentration distribution obtained from a thermal diffusion of atoms having a substitutional atomic diffusion mechanism in Si, as in the case of phosphorus and arsenic. The reason that the trailing portion 16 is formed is as follows. Selenium and sulfur are such that an interstitial atomic diffusion mechanism contributes dominantly to atomic diffusion, because of which a considerable ratio of the selenium or sulfur atoms implanted diffuse to the deepest part of the Si substrate. It is supposed that the trailing portion 16 of the impurity concentration distribution is formed by this selenium or sulfur diffusion. Owing to the existence of the trailing portion 16, the integrated value of the space-charge density increases gently, as a result of which it is possible to spread the space-charge region quickly after the occurrence of a short circuit. The dopant for forming the n-type FS layer 14 in the invention not being limited to selenium or sulfur, it is sufficient that the dopant atoms are such that the interstitial atomic diffusion mechanism is dominant in Si. Specifically, for example, Li (lithium), oxygen, hydrogen, and the like, are also preferable as, depending on the conditions of introduction into and diffusion in Si, they exhibit the kind of dopant concentration distribution of FIG. 7 owing to having the same advantages as selenium or sulfur.

As previously described, an FS-IGBT wherein the n-type FS layer 14 is formed with a low peak impurity concentration and diffused deeply using selenium or the like, and with a small total impurity, in order to avoid destruction due to an avalanche breakdown on the collector side, is such that thermal runaway destruction is liable to occur as a trade-off. Because of this, the FS-IGBT according to the embodiment of the invention has a structure wherein, together with the low peak impurity concentration, deep n-type FS layer 14 formed using selenium in order to avoid short circuit destruction, the $n^+$ type buffer layer 13, in which the peak impurity concentration is controlled, is also provided between the n-type FS layer 14 and $p^+$ type collector layer 15. By providing the $n^+$ type buffer layer 13, the implantation of holes contributing to an increase in leakage current is suppressed, and it is thus also possible to prevent thermal runaway destruction. That is, by adopting an FS-IGBT having the $n^+$ type buffer layer 13 in which the peak impurity concentration is controlled, it is possible to prevent both short circuit destruction and thermal runaway destruction. The peak impurity concentration of the $n^+$ type buffer layer 13 is as previously described referring to FIGS. 3 and 4.

Next, a description will be given of a method of manufacturing the trench-FS-IGBT according to the embodiment of the invention, centered on processes relating to the invention. Firstly, an FZ n-type Si substrate of, for example, a thickness of 625 μm and resistivity of 8 Ωcm is prepared. Next, the plurality of trenches 11 are formed, in a striped planar layout extending in a direction perpendicular to the direction in which the trenches 11 are aligned, on the front surface of the Si substrate, which is to form the $n^-$ type drift layer 1. Next, the gate dielectric film 10 is formed along the inner wall of the trench 11, and the gate electrode 7, formed of polysilicon, is deposited so as to be embedded on the inner side of the gate dielectric film 10 inside the trench 11.

Next, after patterning the gate electrode 7, the p-type base layer 5 is formed by an ion implantation of, for example, boron, using self-alignment with the gate electrode 7 as a mask. Next, arsenic is selectively ion implanted into the p-type base layer 5, thereby forming the $n^+$ type emitter region 4. Also, a p-type dopant is selectively ion implanted into the p-type base layer 5, thereby forming the $p^+$ type contact region 6 so as to be in contact with the $n^+$ type emitter region 4. Next, an interlayer dielectric film is formed on the front surface of the Si substrate. Then, a contact hole is formed in the interlayer dielectric film for the emitter electrode 9 that straddles the p-type base layer 5 surface and $n^+$ type emitter region 4 surface.

Next, the thickness of the Si substrate is reduced to a desired thickness, in the region of 200 μm for example, using back grinding technology whereby grinding, polishing, etching, and the like, of the back surface of the Si substrate are combined. Next, selenium (or sulfur) is ion implanted into the thinly ground back surface of the Si substrate in order to form the n-type FS layer 14. Next, phosphorus is ion implanted into the thinly ground back surface of the Si substrate in order to form the $n^+$ type buffer layer 13. Furthermore, boron is ion implanted into the thinly ground back surface of the Si substrate in order to form the $p^+$ type collector layer 15. The thickness of the $p^+$ type collector layer 15 is less than the thickness of the $n^+$ type buffer layer 13, within a range of, for example, 0.2 μm to 1.0 μm. Next, the dopants implanted into the back surface of the Si substrate in order to form the three layers of the n-type FS layer 14, $n^+$ type buffer layer 13, and $p^+$ type collector layer 15 are simultaneously activated. Specifically, it is possible to achieve an efficient process by carrying out heat treatment for a time within a range of 0.5 hours to 5 hours, for example, 2 hours, at a temperature within a range of 750° C. to 950° C., for example, 830° C., thereby simultaneously activating the dopants implanted in order to form the aforementioned three layers.

Next, an aluminum-silicon (Al—Si) electrode film (metal electrode film) is formed by sputtering on the front surface of the Si substrate. Then, after patterning the Al—Si electrode film to form an Al—Si electrode film that is to become the emitter electrode 9 and an Al—Si electrode film that is to become a gate pad, heat treatment is carried out for one hour at a temperature of 380° C. Next, after depositing a surface protection film (not shown) formed of a polyimide film, or the like, on the front surface side of the Si substrate, an oxide film formed on the back surface of the Si substrate by the heat treatment for forming the Al—Si electrode film is removed, and the collector electrode 8, formed from stacked layers of metal films of aluminum (Al), titanium (Ti), nickel (Ni), gold (Au), and the like, is formed on the surface of the $p^+$ type collector layer 15. Subsequently, this wafer (Si substrate) is diced into chip form IGBTs, whereby the FS-IGBT chip shown in FIG. 1 is completed. The FS-IGBT chip is such that the front surface side Al—Si electrode film in contact with the $n^+$ type emitter region 4 and Al—Si electrode film electrically in contact with the gate electrode 7 are each connected to an external connection terminal by ultrasonic bonding with an Al wire. Also, the FS-IGBT chip is such that the back surface side collector electrode 8 is fixed by soldering to a heat releasing substrate such as a copper substrate (not shown). Subsequently, the FS-IGBT chip is packaged, whereby the FS-IGBT semiconductor device is completed.

The impurity concentration and thickness (or diffusion depth) of each layer described thus far can be obtained by measuring the spread resistance using, for example, a heretofore known spread resistance measuring instrument, and converting from the spread resistance value.

According to the embodiment, the amount of holes implanted from the collector side when a short circuit occurs increases, and the rise of a magnetic field intensity on the collector side is suppressed, by forming an n-type FS layer that is deep and of a low impurity concentration, and that has a gentle concentration gradient, using selenium or sulfur as a dopant. Also, by providing an $n^+$ type buffer layer having a predetermined peak impurity concentration between the n-type FS layer and $p^+$ type collector layer using an ion implantation of phosphorus, it is possible to suppress an implantation into the n-type FS layer of holes contributing to an increase in leakage current. Consequently, it is possible to balance an increase in element breakdown resistance when a short circuit occurs with preventing thermal runaway destruction. Also, according to the embodiment, it is possible to reduce on-state voltage variation by arranging that the peak impurity concentration of the $n^+$ type buffer layer is at least one digit lower than the peak impurity concentration of the $p^+$ type collector layer.

Heretofore, the invention has been described with a trench-FS-IGBT as an example but, the heretofore described embodiment not being limiting, various changes are possible without departing from the scope of the invention. Specifically, the invention can also be applied to, for example, a planar gate FS-IGBT. Also, a description has been given of an FS-IGBT with a breakdown voltage (rated voltage) of 1,700V or more but, the invention not being limited to the heretofore described embodiment, the invention can also be applied to an element with a breakdown voltage such that the rated voltage exceeds 600V. When applying the invention to an element with a rated voltage of 1,200V or more, and furthermore, to an element with a rated voltage of 1,700V or more, wherein the impurity concentration of the drift layer is equal to or lower than the concentration of holes or electrons existing when a short circuit occurs, an advantage is achieved in that an increase in electrical field concentration in the vicinity of the back surface collector layer is suppressed, as heretofore described.

As heretofore described, the semiconductor device and semiconductor device manufacturing method according to the invention are useful in power semiconductor devices used in the field of industrial instruments such as general purpose and electric vehicle inverters and AC servos, uninterruptible power supplies (UPS), and switching power supplies, and in the field of consumer instruments such as microwave cookers, rice cookers, and stroboscopes.

What is claimed is:

1. A method of manufacturing a semiconductor device including a first conductivity type drift layer formed of a first conductivity type semiconductor substrate, MOS gate structure formed of at least a gate electrode, a gate dielectric film, and the first conductivity type semiconductor substrate provided on one main surface side of the first conductivity type semiconductor substrate, a second conductivity type collector layer provided on the other main surface of the first conductivity type semiconductor substrate, a first conductivity type field-stop layer provided between the first conductivity type drift layer and second conductivity type collector layer and having an impurity concentration higher than that of the first conductivity type drift layer, and a first conductivity type buffer layer provided between the first conductivity type field-stop layer and second conductivity type collector layer and having an impurity concentration higher than that of the first conductivity type field-stop layer, the manufacturing method comprising:

a MOS gate structure formation step of forming the MOS gate structure on the one main surface side of the first conductivity type semiconductor substrate;

a substrate thinning step of grinding the other main surface of the first conductivity type semiconductor substrate to reduce the first conductivity type semiconductor substrate to a predetermined thickness;

an implantation step of ion implanting dopants into the ground surface of the first conductivity type semiconductor substrate in order to form each of the first conductivity type field-stop layer, first conductivity type buffer layer, and second conductivity type collector layer;

an activation step of carrying out heat treatment for simultaneously electrically activating a plurality of dopants ion implanted into the ground surface of the first conductivity type semiconductor substrate; and an electrode film formation step of forming a metal electrode film by sputtering on the one main surface of the first conductivity type semiconductor substrate and carrying out heat treatment, wherein selenium or sulfur for forming the first conductivity type field-stop layer, phosphorus for forming the first conductivity type buffer layer, and boron for forming the second conductivity type collector layer are sequentially ion implanted as a plurality of the dopant in the implantation step, and the plurality of the dopant are simultaneously activated by the heat treatment in the activation step, wherein the implantation step and activation step are carried out so that the net doping concentration of the first conductivity type field-stop layer is higher than the net doping concentration of the first conductivity type drift layer, the depth of the first conductivity type field-stop layer is 20 µm or more, the impurity concentration distribution of the first conductivity type field-stop layer has a concentration gradient that decreases from the other main surface side of the first conductivity type semiconductor substrate toward the one main surface side, and the maximum impurity concentration of the first conductivity type buffer layer is higher than the maximum impurity concentration of the first conductivity type field-stop layer at $6\times10^{15}$ cm$^{-3}$ or more, and one-tenth or less of the maximum impurity concentration of the second conductivity type collector layer.

2. The semiconductor device manufacturing method according to claim 1, wherein the implantation step and activation step are carried out so that the total amount of the net doping concentration of the first conductivity type field-stop layer and net doping concentration of the first conductivity type drift layer has a value such that a depletion layer edge of a depletion layer spreading in the first conductivity type drift layer and first conductivity type field-stop layer in response to an application of a rated voltage is inside the first conductivity type field-stop layer.

3. The method of manufacturing a semiconductor device according to claim 1, wherein the impurity concentration of the first conductivity type field-stop layer is maximum at the side defining the boundary with the first conductivity type buffer layer, and the impurity concentration of the first conductivity type field-stop layer decreases, while the size of the concentration gradient becomes gradually smaller, from the position at which the impurity concentration is maximum toward the one main surface side of the first conductivity type semiconductor substrate reaches to the first conductivity type drift layer.

4. The method of manufacturing a semiconductor device according to claim 1, wherein the concentration gradient of the first conductivity type field-stop layer becomes gradual as it approaches the one main surface side of the first conductivity type semiconductor substrate, toward the one main surface side of the first conductivity type semiconductor substrate.

5. The method of manufacturing a semiconductor device according to claim 1, wherein the impurity concentration distribution of the first conductivity type field-stop layer has a first concentration gradient such that the impurity concentration decreases steeply from the second conductivity type collector layer side toward the first conductivity type drift layer side, and has a second concentration gradient such that the impurity concentration decreases toward the first conductivity type drift layer side more gently than in the first concentration gradient in a portion deeper to the first conductivity type drift layer side than a portion having the first concentration gradient.

6. The method of manufacturing a semiconductor device according to claim 1, wherein the size of the concentration gradient of the first conductivity type field-stop layer becomes gradually smaller from the position of the maximum impurity concentration of the first conductivity type field-stop layer toward the one main surface side of the first conductivity type semiconductor substrate.

\* \* \* \* \*